(12) United States Patent
Madni et al.

(10) Patent No.: US 6,407,632 B1
(45) Date of Patent: Jun. 18, 2002

(54) RADIO FREQUENCY AMPLIFIER

(75) Inventors: Arshad Madni; Lance R Trodd, both of Swindon (GB)

(73) Assignee: Mitel Semiconductor Limited, Wiltshire (GB)

(*) Notice: Subject to any disclaimer, the term of this patent is extended or adjusted under 35 U.S.C. 154(b) by 0 days.

(21) Appl. No.: 09/611,720

(22) Filed: Jul. 5, 2000

(30) Foreign Application Priority Data

Jul. 8, 1999 (GB) .............................................. 9915919

(51) Int. Cl.[7] .............................. H03F 1/36; H03F 3/45
(52) U.S. Cl. .......................................... 330/85; 330/254
(58) Field of Search .............................. 330/88, 98, 99, 330/100, 133, 134, 254, 285; 327/359

(56) References Cited

U.S. PATENT DOCUMENTS 4,562,406 A * 12/1985 Baker ........................... 330/85
5,736,900 A * 4/1998 Smith ........................ 330/85 X

* cited by examiner

*Primary Examiner*—Steven J. Mottola
(74) *Attorney, Agent, or Firm*—Kirschstein, et al.

(57) ABSTRACT

A radio frequency amplifier comprises an input amplifier provided with a shunt feedback path for determining the input impedance. A first transconductance amplifier forms part of a series feedback arrangement with a resistor around the amplifier so as to boost the effective value of the resistor. An identical transconductance amplifier is connected to the output of the input amplifier and its output forms the output of the radio frequency amplifier.

13 Claims, 4 Drawing Sheets

RADIO FREQUENCY AMPLIFIER

BACKGROUND OF THE INVENTION

1. Field of the Invention

The present invention relates to a radio frequency amplifier which may, for example, be used in television, satellite and cable tuners.

2. Description of the Prior Art

It is a requirement of radio frequency amplifiers to be able to handle large amplitude signals while having a good noise figure so as to handle signals which may have a very large range of amplitudes. Various feedback techniques have been used to attempt to achieve this. Also, such amplifiers have generally been embodied by discrete components, which occupy a substantial area of printed circuit board and which are relatively expensive. It would thus be advantageous to be able to form such amplifiers in integrated circuits.

GB 2 295 934 discloses a radio frequency amplifier which uses positive feedback to boost its load resistance. The amplifier comprises an input stage whose output is connected to a load resistance. A transconductance amplifier has an input connected to the output of the input stage and an output connected to a resistor of the input stage so as to provide series negative feedback. The output of the input stage also supplies a further transconductance amplifier whose output is fed back to the load resistor to provide positive feedback in order to increase the effective resistance.

U.S. Pat. No. 5,661,437 discloses an arrangement for providing variable gain in a negative feedback amplifier. The amplifier comprises a common source FET gain stage with shunt feedback via a common drain FET. The gain is controlled by varying the bias voltage of the gate or drain of the feedback FET.

SUMMARY OF THE INVENTION

According to the invention, there is provided a radio frequency amplifier comprising: an input amplifier having an input for receiving input signals and an output; a first transconductance amplifier having an input connected to said output of said input amplifier and an output connected to provide series negative feedback to said input amplifier; and a second transconductance amplifier substantially identical to said first transconductance amplifier and having an input connected to said output of said input amplifier and an output forming an output of said radio frequency amplifier.

Said input amplifier may comprise a first resistor and first and second amplifying devices having common electrodes connected together by said first resistor, said output of said first transconductance amplifier being connected to said first resistor. Said first transconductance amplifier may comprise third and fourth amplifying devices having output electrodes connected to said common electrodes of said first and second amplifying devices. Said radio frequency amplifier may comprise first and second capacitors, said first and second amplifying devices having output electrodes and said third and fourth amplifying devices having input electrodes connected to said output electrodes of said first and second amplifying devices via said first and second capacitors, respectively. Said third and fourth amplifying devices may have input electrodes and said second transconductance amplifier may comprise fifth and sixth amplifying devices having input electrodes connected to said input electrodes of said third and fourth amplifying devices, respectively.

Said input amplifier may have a shunt negative feedback path to said input thereof Said first and second amplifying devices may have input and output electrodes and said shunt negative feedback path may comprise first and second voltage followers having inputs connected to said output electrodes of said first and second amplifying devices, respectively, and outputs connected to said input electrodes of said first and second devices, respectively.

The radio frequency amplifier may comprise a variable gain amplifier connected to said output of said second transconductance amplifier and having an output. The radio frequency amplifier may comprise a mixer connected to said output of said variable gain amplifier. Said mixer may comprise first and second inputs, first and second local oscillator inputs, first and second mixer outputs and seventh to tenth amplifying devices having common, control and output electrodes, said common electrodes of said seventh and eight amplifying devices being connected to said first signal input and said common electrodes of said ninth and tenth amplifying devices being connected to said second signal input, said control electrodes of said seventh and tenth amplifying devices being connected to said first local oscillator input and said control electrodes of said eight and ninth amplifying devices being connected to said second local oscillator input, said output electrodes of said seventh and ninth amplifying devices being connected to said first mixer output and said output electrodes of said eight and tenth amplifying devices being connected to said second mixer output. Said variable gain amplifier may comprise third and fourth signal inputs, first and second gain control inputs, first and second variable gain amplifier outputs, a power supply input and eleventh to fourteenth amplifying devices having common, control and output electrodes, said common electrodes of said eleventh and twelfth amplifying devices being connected to said third signal input and said common electrodes of said thirteenth and fourteenth amplifying devices being connected to said fourth signal input, said control electrodes of said eleventh and fourteenth amplifying devices being connected to said first gain control input and said control electrodes of said twelfth and thirteenth amplifying devices being connected to said second gain control input, said output electrodes of said eleventh and fourteenth amplifying devices being connected to said first and second variable gain amplifier outputs, respectively, and said output electrodes of said twelfth and thirteenth amplifying devices being connected to said power supply input.

The radio frequency amplifier may be formed in an integrated circuit.

It is thus possible to provide a radio frequency amplifier with an excellent noise figure and the capability of handling large input signal levels with good linearity so as to provide a wide dynamic range. The use of active boosted series feedback enhances the linearity of the amplifier without degrading the noise figure. The use of translinear techniques maintains the linearity over a large range of input signals. Further, the radio frequency amplifier may readily be made as an integrated circuit or as part of an integrated circuit. Thus, compared with known discrete component amplifiers, there is a saving in cost and a reduction in the required printed circuit board area.

BRIEF DESCRIPTION OF THE DRAWINGS

The invention will be further described by way of example, with reference to the accompanying drawings, in which.

Like reference numerals refer to like parts throughout the drawings.

DESCRIPTION OF THE PREFERRED EMBODIMENTS

Figure 1:
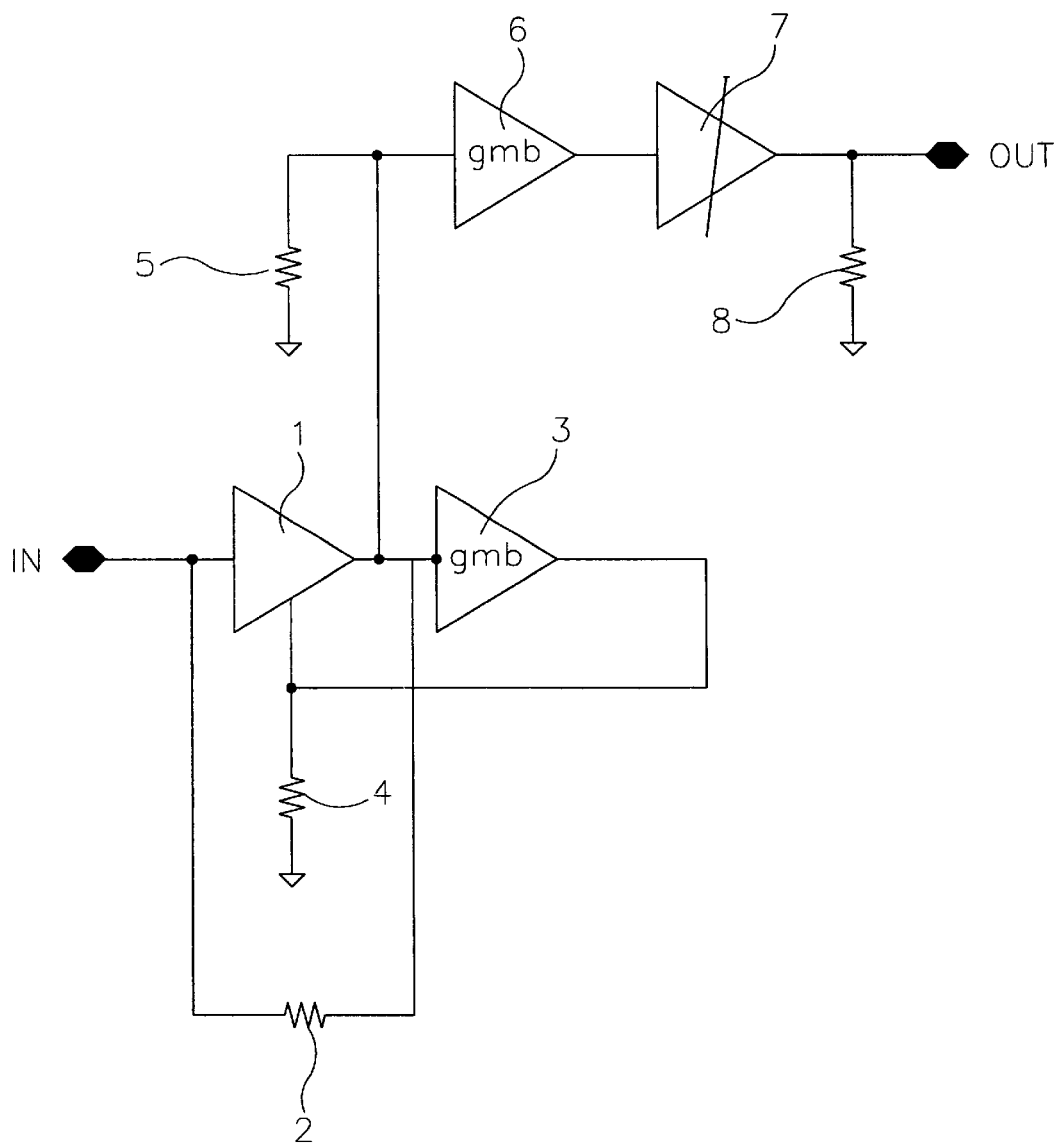
FIG. 1 is a block schematic diagram of a radio frequency amplifier constituting an embodiment of the invention.

The radio frequency amplifier shown in FIG. 1 comprises an input amplifier 1 having an input IN for receiving input radio frequency signals. The input IN may be connected to a terrestrial broadcast aerial, to a satellite "dish" or to a cable distribution system and may receive television, radio or data signals or a combination thereof The input amplifier 1 has a shunt or current negative feedback loop including a feedback resistor 2.

The output of the input amplifier 1 is connected to the input of a first transconductance amplifier 3. The output of the amplifier 3 is connected to a feedback input of the input amplifier 1 across a resistor 4. The amplifier 3 and the resistor 4 form a "boosted" series or voltage negative feedback path around the input amplifier 1.

The output of the input amplifier 1 is provided with a load resistor 5 and is connected to the input of a second transconductance amplifier 6 which is substantially identical to the first transconductance amplifier 3. The output of the amplifier 6 is connected to the input of a variable gain amplifier 7 forming part of an automatic gain control (AGC) circuit. The output of the amplifier 7 is provided with a load resistor 8 and is connected to the output OUT of the radio frequency amplifier.

The series negative feedback around the input amplifier 1 boosts or increases the effective value of the resistor 4 so that the transconductance of the input amplifier 1 is reduced. However, this does not affect the noise figure, which is determined (in part) by the actual resistance of the resistor 4. The input impedance of the input amplifier 1 is determined by the loop gain of the input amplifier 1 because of the shunt negative feedback via the resistor 2.

The gain A of the input amplifier 1 is given by:

$$A = \frac{-Rl}{(1 + gmb \cdot Rl)Re}$$

where Rl is the value of the load resistor 5, Re is the value of the resistor 4 and gmb is the transconductance of the transconductance amplifier 3.

The input impedance Zin of the input amplifier 1 is given by:

$$Zin = \frac{Rf}{1 + |A|}$$

where Rf is the value of the shunt feedback resistor 2.

The overall voltage gain G of the radio frequency amplifier from the input terminal IN to the output terminal OUT is given by:

$$G = \frac{-RL \cdot \lambda}{(1 + gmb \cdot Rl)Re}$$

where RL is the value of the resistor 8 and λ is the gain of the amplifier 7 which generally varies between 0 and −1.

Figure 2:
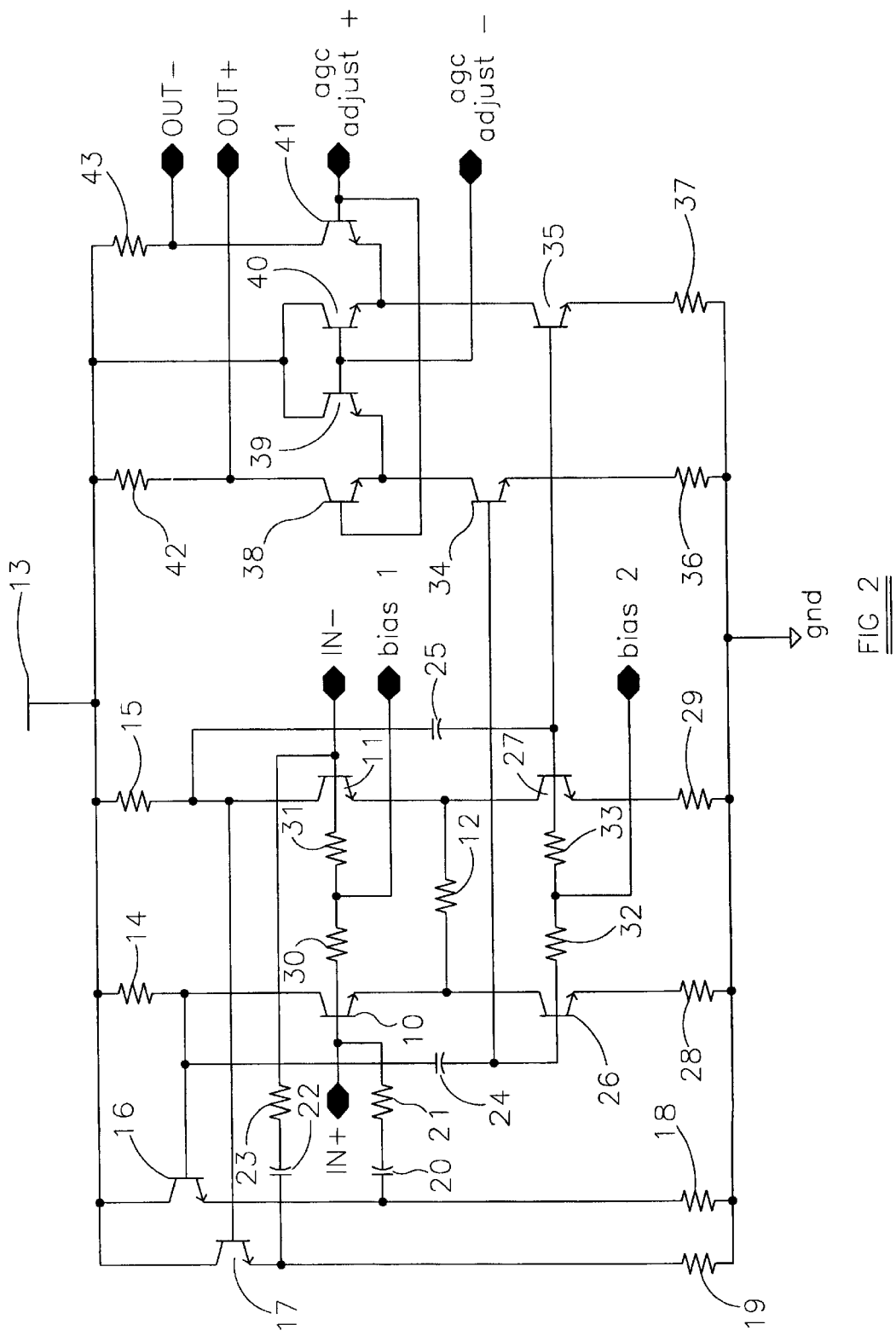
FIG. 2 is a circuit diagram of the amplifier shown in FIG. 1.

The radio frequency amplifier of FIG. 1 is shown in more detail in FIG. 2 and is embodied by NPN bipolar transistors. The input amplifier 1 comprises transistors 10 and 11 whose emitters are connected together by a resistor 12, which is equivalent to the resistor 4 shown in FIG. 1 but which has twice the resistance. The inputs of the transistors 10 and 11 are connected to differential inputs IN+ and IN−, respectively, whereas the collectors of the transistors 10 and 11 are connected to a first power supply input or line 13 via load resistors 14 and 15, respectively, which correspond to the resistor 5 of FIG. 1. The collectors of the transistors 10 and 11 are connected to the inputs of voltage followers in the form of emitter followers comprising transistors 16 and 17. The collectors of the transistors 16 and 17 are connected to the supply line 13 whereas the emitters of the transistors 16 and 17 are connected via resistors 18 and 19, respectively, to ground gnd. The emitter of the transistor 16 is connected to the input IN+ via a capacitor 20 and a resistor 21 whereas the emitter of the transistor 17 is connected to the input IN− via a capacitor 22 and a resistor 23. Each of the resistors 21 and 23 is equivalent to the shunt feedback resistor 2 shown in FIG. 1.

The collectors of the transistors 10 and 11 constitute the output of the input amplifier 1 shown in FIG. 1 and are connected via capacitors 24 and 25, respectively, to the bases of transistors 26 and 27, respectively, which, together with emitter resistors 28 and 29, form the first transconductance amplifier 3 shown in FIG. 1. The collectors of the transistors 26 and 27 are connected to the emitters of the transistors 10 and 11, respectively. The bases of the transistors 10 and 11 are connected via resistors 30 and 31, respectively, to a first bias input whereas the bases of the transistors 26 and 27 are connected via resistors 32 and 33, respectively, to a second bias input.

The second transconductance amplifier 6 is formed by transistors 34 and 35 provided with emitter resistors 36 and 37, respectively. The transistors 26, 27, 34 and 35 are substantially identical (within manufacturing tolerances) and the resistors 28, 29, 36 and 37 likewise are of substantially the same value (within manufacturing tolerances). The second transconductance amplifier is therefore substantially identical to the first transconductance amplifier.

The bases of the transistors 34 and 35 are connected to the bases of the transistors 26 and 27, respectively. Thus, the input of the second transconductance amplifier is connected to the input of the first transconductance amplifier and to the output of the input amplifier, all of which are of differential topology.

The collectors of the transistors 34 and 35 effectively form outputs of the radio frequency amplifier and may be provided with suitable collector loads, such as resistors, across which the differential output voltage may be formed. However, the collectors of the transistors 34 and 35 may be connected to a mixer, for example of the Gilbert cell type, or to a variable gain amplifier as shown in FIGS. 1 and 2. The variable gain amplifier 7 shown in FIG. 2 is embodied by transistors 38 to 41 and collector load resistors 42 and 43. The emitters of the transistors 38 and 39 are connected to the collector of the transistors 34 whereas the emitters of the transistors 40 and 41 are connected to the collector of the transistor 35. The bases of the transistors 38 and 41 are connected to an input "agc adjust+" whereas the bases of the transistors 39 and 40 are connected to an input "agc adjust−". These inputs receive a control voltage for controlling the gain so as to provide AGC. The collectors of the transistors 39 and 40 are connected to the supply line 13. The collectors of the transistors 38 and 41 are connected to the collector load resistors 42 and 43 and to outputs OUT+ and OUT−, respectively. The variable gain amplifier 7 is thus of the current steering type.

The gain A of the input amplifier is given by:

$$A = \frac{-Rl}{Rel\left(1 + \frac{Rl}{Re2 + re}\right) + re}$$

where Rl is the value of each of the resistors 14 and 15, Re1 is half the value of the resistor 12, Re2 is the value of each of the resistors 28 and 29 and re is the internal emitter resistance or diode impedance of each of the transistors 10 and 11.

The input impedance Zin is given by:

$$Zin = \frac{2Rf}{2 + |A|}$$

where Rf is the value of each of the resistors 21 and 23.

The gain G of the whole radio frequency amplifier is given by:

$$G = \frac{-Rl \cdot \lambda}{Rel + \left(1 + \frac{Rl}{Re2 + re}\right) + re}$$

where λ is again the gain of the current steering amplifier formed by the transistors 38 to 41.

The effective value of the external emitter resistance Re1 (half of the resistor 12) is boosted by (1+Rl/(Re2+re)) and this can be achieved without degrading the noise figure. This may be achieved by maximising the gain A and the ratio of Rl to (Re2+re) while keeping Re2 small and maximising Re2/re.

The variable gain amplifier shown in FIG. 2 may be replaced by a mixer, for example of the Gilbert cell type. Alternatively, the outputs of the variable gain amplifier may be used to drive a mixer of the Gilbert type as shown in FIG. 3.

The Gilbert cell mixer comprises transistors 45 to 48. The emitters of the transistors 45 and 46 are connected to the collector of the transistor 38 whereas the emitters of the transistors 47 and 48 are connected to the collector of the transistor 41. The bases of the transistors 45 and 48 are connected to a first local oscillator input LO+ whereas the bases of the transistors 46 and 47 are connected to a second local oscillator input LO−. The collectors of the transistors 45 and 47 are connected to the load resistor 42 and to a first mixer output OUT+ whereas the collectors of the transistors 46 and 48 are connected to the load resistor 43 and to a second mixer output OUT−.

It is thus possible to provide a radio frequency amplifier, a variable gain amplifier forming part of an AGC circuit and a mixer in a compact and elegant circuit arrangement, all of which may be formed in an integrated circuit which may include other circuit arrangements forming part of a tuner.

Figure 3:
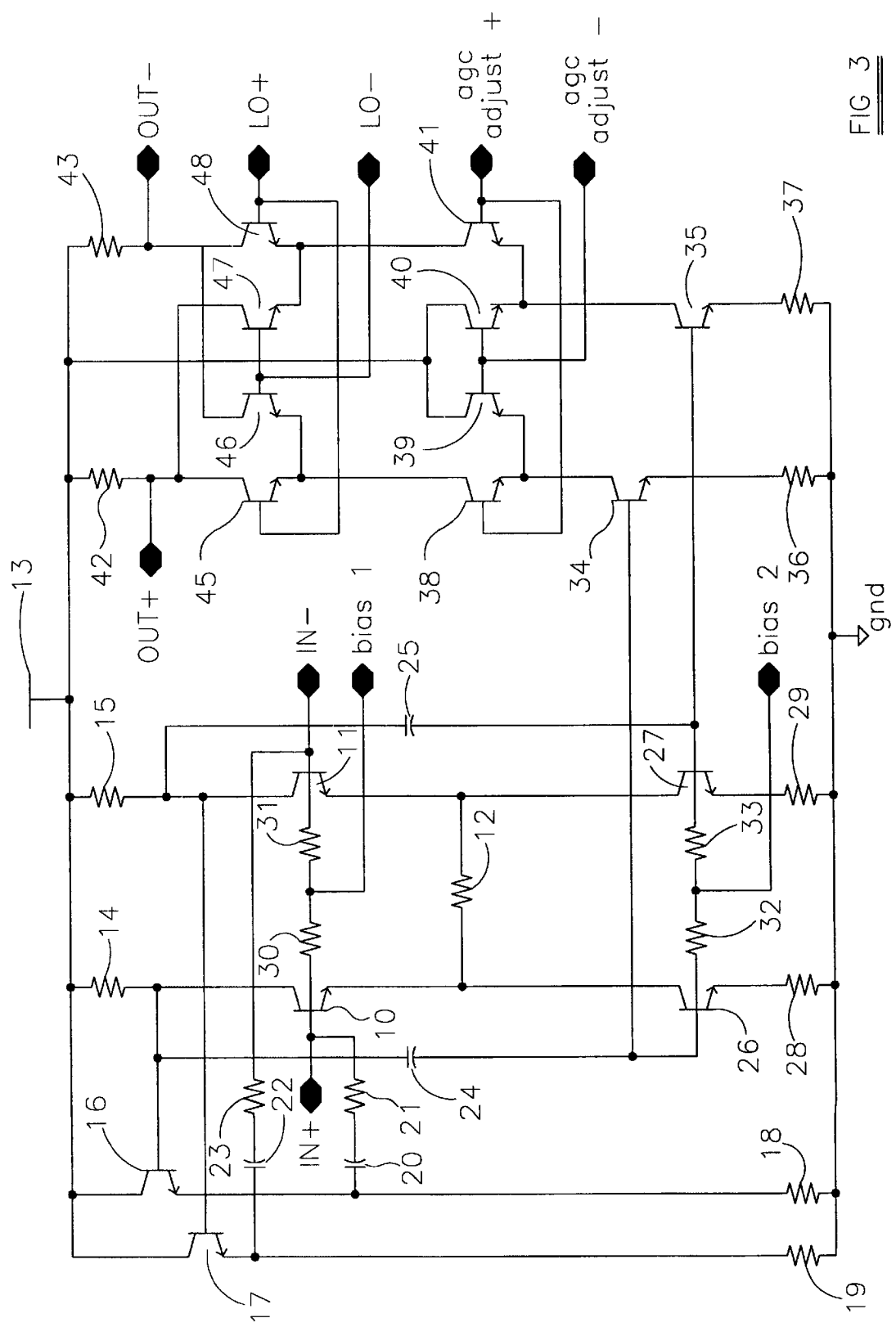
FIG. 3 is a circuit diagram of a radio frequency amplifier constituting another embodiment of the invention.

The radio frequency amplifiers shown in FIGS. 2 and 3 are embodied using bipolar transistors. However, the radio frequency amplifier may be embodied with field effect transistors and FIG. 4 shows a CMOS arrangement which is equivalent to the radio frequency amplifier shown in FIG. 2.

Figure 4:
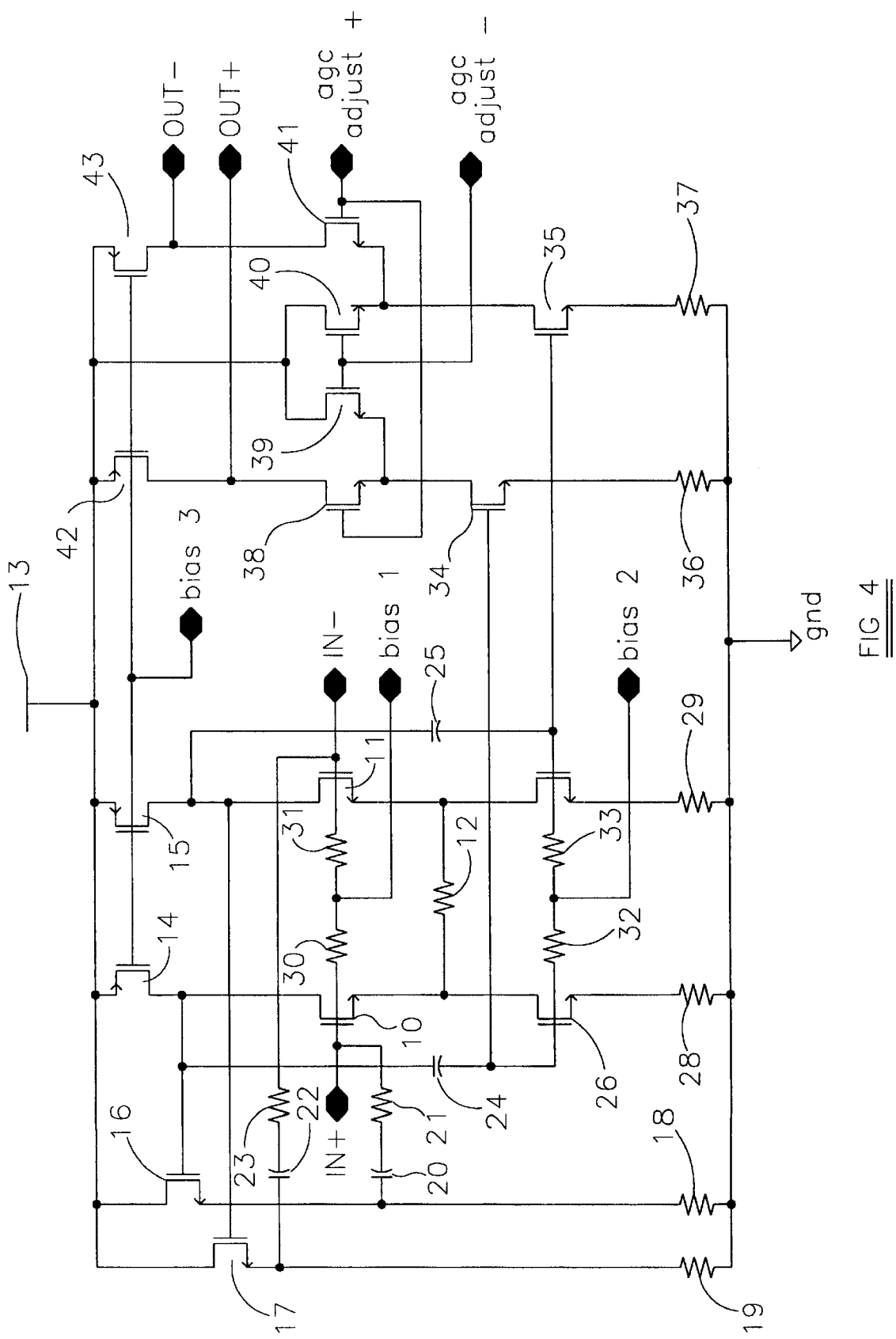
FIG. 4 is a circuit diagram of a radio frequency amplifier constituting a further embodiment of the invention.

In FIG. 4, the transistors 10, 11, 16, 17, 26, 27, 34, 35 and 38 to 41 are N-type field effect transistors. The load resistors 14, 15, 42 and 43 of FIG. 2 are replaced by P-type field effect transistors whose gates are connected together to a third bias voltage input. Otherwise, the circuit of FIG. 4 is substantially identical to the circuit of FIG. 2.

What is claimed is:

1. A radio frequency amplifier, comprising: an input amplifier having an input terminal for receiving input signals and an output; a first transconductance amplifier having an input connected to said output of said input amplifier and an output connected to provide series negative feedback to another terminal of said input amplifier; and a second transconductance amplifier substantially identical to said first transconductance amplifier and having an input connected to said output of said input amplifier and an output forming an output of said radio frequency amplifier.

2. A radio frequency amplifier, comprising: an input amplifier having an input for receiving input signals and an output, said input amplifier comprising a first resistor and first and second amplifying devices having common electrodes connected together by said first resistor; a first transconductance amplifier having an input connected to said output of said input amplifier and an output connected to provide series negative feedback to said input amplifier, said output of said first transconductance amplifier being connected to said first resistor; and a second transconductance amplifier substantially identical to said first transconductance amplifier and having an input connected to said output of said input amplifier and an output forming an output of said radio frequency amplifier.

3. The radio frequency amplifier as claimed in claim 2, in which said first transconductance amplifier comprises third and fourth amplifying devices having output electrodes connected to said common electrodes of said first and second amplifying devices.

4. The radio frequency amplifier as claimed in claim 3, comprising first and second capacitors, said first and second amplifying devices having output electrodes and said third and fourth amplifying devices having input electrodes connected to said output electrodes of said first and second amplifying devices via said first and second capacitors, respectively.

5. The radio frequency amplifier as claimed in claim 3, in which said third and fourth amplifying devices have input electrodes and said second transconductance amplifier comprises fifth and sixth amplifying devices having input electrodes connected to said input electrodes of said third and fourth amplifying devices, respectively.

6. A radio frequency amplifier, comprising: an input amplifier having an input for receiving input signals and an output, said input amplifier having a shunt negative feedback path to said input thereof; a first transconductance amplifier having an input connected to said output of said input amplifier and an output connected to provide series negative feedback to said input amplifier; and a second transconductance amplifier substantially identical to said first transconductance amplifier and having an input connected to said output of said input amplifier and an output forming an output of said radio frequency amplifier.

7. The radio frequency amplifier as claimed in claim 2, in which said input amplifier has a shunt negative feedback path to said input thereof.

8. The radio frequency amplifier as claimed in claim 7, in which said first and second amplifying devices have input and output electrodes, and in which said shunt negative feedback path comprises first and second voltage followers having inputs connected to said output electrodes of said first and second amplifying devices, respectively, and outputs are connected to said input electrodes of said first and second devices, respectively.

9. The radio frequency amplifier as claimed in claim 1, comprising a variable gain amplifier connected to said output of said second transconductance amplifier and having an output.

10. The radio frequency amplifier as claimed in claim 9, comprising a mixer connected to said output of said variable gain amplifier.

11. The radio frequency amplifier as claimed in claim 10, in which said mixer comprises first and second signal inputs, first and second local oscillator inputs, first and second mixer outputs and seventh to tenth amplifying devices having common, control and output electrodes, said common electrodes of said seventh and eighth amplifying devices being connected to said first signal input and said common electrodes of said ninth and tenth amplifying devices being connected to said second signal input, said control electrodes of said seventh and tenth amplifying devices being connected to said first local oscillator input and said control electrodes of said eighth and ninth amplifying devices being connected to said second local oscillator input, said output electrodes of said seventh and ninth amplifying devices being connected to said first mixer output and said output electrodes of said eighth and tenth amplifying devices being connected to said second mixer output.

12. The radio frequency amplifier as claimed in claim 11, in which said variable gain amplifier comprises third and fourth signal inputs, first and second gain control inputs, first and second variable gain amplifier outputs, a power supply input and eleventh to fourteenth amplifying devices having common, control and output electrodes, said common terminals of said eleventh and twelfth amplifying devices being connected to said third signal input and said common electrodes of said thirteenth and fourteenth amplifying devices being connected to said fourth signal input, said control electrodes of said eleventh and fourteenth amplifying devices being connected to said first gain control input and said control electrodes of said twelfth and thirteenth amplifying devices being connected to said second gain control input, said output electrodes of said eleventh and fourteenth amplifying devices being connected to said first and second variable gain amplifier outputs, respectively, and said output electrodes of said twelfth and thirteenth amplifying devices being connected to said power supply input.

13. The radio frequency amplifier as claimed in claim 1, formed in an integrated circuit.

\* \* \* \* \*